US009899950B2

(12) United States Patent
Rechberger et al.

(10) Patent No.: US 9,899,950 B2
(45) Date of Patent: Feb. 20, 2018

(54) INVERTER FOR AN ELECTRIC MACHINE, ELECTRIC DRIVE DEVICE FOR A MOTOR VEHICLE AND METHOD FOR OPERATING AN INVERTER

(71) Applicant: AUDI AG, Ingolstadt (DE)

(72) Inventors: Klaus Rechberger, Ludwigsburg (DE); Jan Wischerath, Ingolstadt (DE)

(73) Assignee: Audi AG, Ingolstadt (DE)

( * ) Notice: Subject to any disclaimer, the term of this patent is extended or adjusted under 35 U.S.C. 154(b) by 0 days.

(21) Appl. No.: 15/336,161

(22) Filed: Oct. 27, 2016

(65) Prior Publication Data

US 2017/0126165 A1    May 4, 2017

(30) Foreign Application Priority Data

Oct. 28, 2015  (DE) .................. 10 2015 013 875

(51) Int. Cl.
*H02P 1/04*      (2006.01)
*H02P 27/06*     (2006.01)
(Continued)

(52) U.S. Cl.
CPC .......... *H02P 27/06* (2013.01); *B60L 11/1803* (2013.01); *H02P 29/0241* (2016.02)

(58) Field of Classification Search
CPC .................. H02H 9/00; H02H 7/122
(Continued)

(56) References Cited

U.S. PATENT DOCUMENTS 5,650,906 A    7/1997 Marquardt et al.
8,827,736 B2   9/2014 Wischerath et al.
(Continued)

FOREIGN PATENT DOCUMENTS

DE    40 37 348 C1    2/1992
DE    100 05 449 A1   8/2001
(Continued)

OTHER PUBLICATIONS

K.H. Chao & C.M. Liaw: "Three-phase soft-switching inverter for induction motor drives", May 17, 2000; IEEE Proceedings on Electric Power Applications.
(Continued)

*Primary Examiner* — Bickey Dhakal
(74) *Attorney, Agent, or Firm* — Henery M. Feiereisen LLC

(57) ABSTRACT

An inverter for an electric machine includes multiple phase systems, each including a high-side switching device and a low-side switching device, the high-side switching device being connected on one side to a first pole of an intermediate circuit and on another side to the low-side switching device, the low-side switching device being connected on one side to the high-side switching device and on the other side to a second pole of the intermediate circuit, the high-side switching device and the low-side switching device each having a circuit breaker which has a switching input, a power input and a power output, the power input and the power output being electrically connected with each other when the circuit breaker is closed and are electrically disconnected from each other when the circuit breaker is open. The inverter further has a control circuit and an intermediate circuit voltage limiting circuit.

8 Claims, 1 Drawing Sheet

(51) Int. Cl.
*H02P 29/024* (2016.01)
*B60L 11/18* (2006.01)

(58) Field of Classification Search
USPC .................................................. 318/400.17
See application file for complete search history.

(56) References Cited

U.S. PATENT DOCUMENTS

| | | | |
|---|---|---|---|
| 2001/0026427 | A1 | 10/2001 | Mahlein et al. |
| 2004/0169975 | A1 | 9/2004 | Muenzer et al. |
| 2009/0296291 | A1* | 12/2009 | Volke ............... H03K 17/0822 361/56 |
| 2011/0164443 | A1* | 7/2011 | Chen ................. H02M 7/53873 363/132 |

FOREIGN PATENT DOCUMENTS

| | | |
|---|---|---|
| DE | 102 31 198 A1 | 1/2004 |
| DE | 10 2010 001 924 A1 | 8/2011 |
| DE | 10 2012 109 283 A1 | 4/2014 |
| EP | 0 680 147 A2 | 11/1995 |
| EP | 1 128 539 A2 | 8/2001 |
| EP | 2 518 885 | 10/2012 |
| WO | WO 9423497 | 10/1994 |

OTHER PUBLICATIONS

"Elektroauto" in Wikipedia, Oct. 27, 2015.
English version of "Elektroauto" in Wikipedia, Oct. 27, 2015, for translation purposes only.
European Search Report dated Mar. 14, 2017 with respect to counterpart European patent application EP 16 19 262.3.
English translation of European Search Report dated Mar. 14, 2017 with respect to counterpart European patent application EP 16 19 262.3.

* cited by examiner

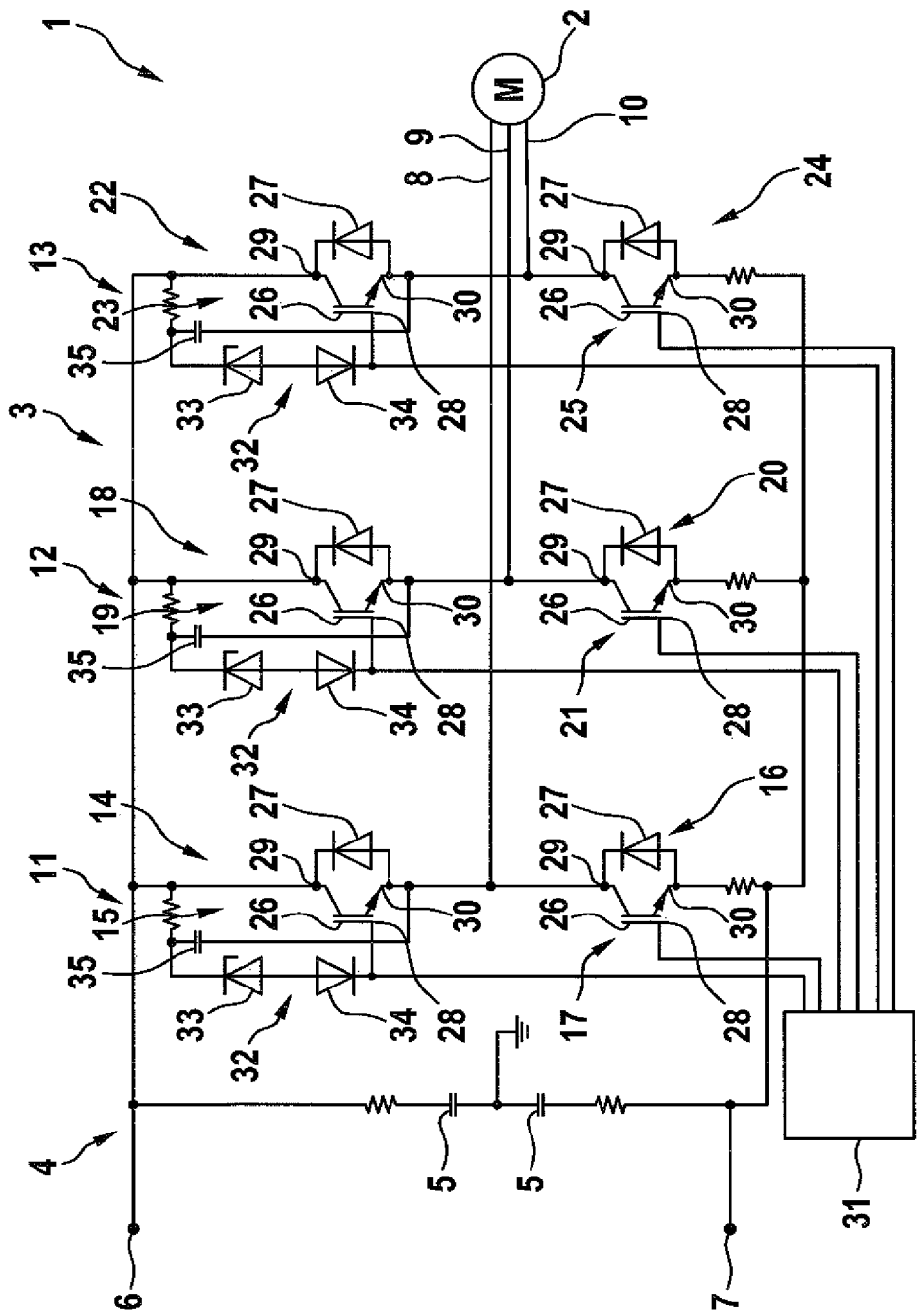

INVERTER FOR AN ELECTRIC MACHINE, ELECTRIC DRIVE DEVICE FOR A MOTOR VEHICLE AND METHOD FOR OPERATING AN INVERTER

CROSS-REFERENCES TO RELATED APPLICATIONS

This application claims the priority of German Patent Application, Serial No. 10 2015 013 875.8, filed Oct. 28, 2015, pursuant to 35 U.S.C. 119(a)-(d), the content of which is incorporated herein by reference in its entirety as if fully set forth herein.

BACKGROUND OF THE INVENTION

The invention relates to an inverter for an electric machine.

The following discussion of related art is provided to assist the reader in understanding the advantages of the invention, and is not to be construed as an admission that this related art is prior art to this invention.

The electric machine serves for example for driving the motor vehicle, i.e., for providing a torque that is directed towards propulsion of the motor vehicle. Because an onboard network of the motor vehicle usually provides a DIC current but the electric machine is constructed as an A/C current machine or three-phase machine, the inverter is provided. The inverter serves for converting the DIC current into A/C current or three-phase current. The inverter is for example constructed as a pulse inverter or as an H-bridge.

The inverter has the intermediate circuit or is at least connected to the intermediate circuit. The intermediate circuit includes the first electrical pole and the second electrical pole, which have different potentials compared to teach other. For example the first electrical pole is a plus pole and the second electrical pole is a minus pole. The inverter also includes the multiple phase systems, i.e., at least two phase systems (in the case of conversion of a DIC current into NC current) or at least three phase systems (in the case of conversion into a three phase current). Each of the phase systems has a high-side switching device and a low-side switching device, which are connected in series with each other and are connected on one side to the first electrical pole and on the other side to the second electrical pole.

In other words the high-side switching device is thus connected on one side to the first electrical pole and on the other side to the low-side switching device, while the low-side switching device is connected on one side to the high-side switching device and on the other side to the second electrical pole. Each of the switching devices, i.e., the high-side switching device as well as the low-side switching device, has a circuit breaker which has the power input and the power output. When a voltage is present at the switching input or an electrical current flows from the switching input to the power output the circuit breaker closes, so that the power input is eclectically connected with the power output. When on the other hand the switching input is without voltage or without current the circuit breaker is open and correspondingly the power input and the power output are electrically separated from each other.

The circuit breaker is for example a transistor, in particular a bipolar transistor or a field effect transistor. The field effect transistor can hereby be configured as a bipolar transistor with insulated gate electrode (IGBT), the field effect transistor as barrier junction field effect transistor or as a metal insulator semiconductor field effect transistor (MIS-FET) or a field-effect transistor with a gate, which is separated by an insulator (IGFET). Of course the circuit breaker can also have an alternative configuration.

More concretely regarding the above description the power input of the circuit breaker of the high-side switching device is permanently connected with the first electrical pole, while its power output is permanently connected with the power input of the circuit breaker of the low-side switching device. The power output of the low-side switching device is permanently connected with the second pole. Between the high-side switching device and the low-side switching device a phase connection for the electric machine can be provided, in particular an electrical connection of the electric machine is connected between the high-side switching device and the low-side switching device.

It would be desirable and advantageous to provide an inverter for an electric machine that has advantages compared to known inverters and that can in particular be operated reliably also in case of an error.

SUMMARY OF THE INVENTION

According to one aspect of the present invention An Inverter for an electric machine, wherein the inverter, includes: multiple phase systems, each of the multiple phase systems comprising a high-side switching device and a low-side switching device, the high-side switching device being connected on one side to a first pole of an intermediate circuit and on another side to the low-side switching device, the low-side switching device being connected on one side to the high-side switching device and on the other side to a second pole of the intermediate circuit, the high-side switching device and the low-side switching device each having a circuit breaker which has a switching input, a power input and a power output, the power input and said power output being electrically connected with each other when the circuit breaker is closed and are electrically disconnected from each other when the circuit breaker is open; a control circuit; and an intermediate circuit voltage limiting circuit, the switching input of the circuit breaker of at least one of the high-side switching device and the low-side switching device being connected to the control circuit and to the intermediate circuit voltage limiting circuit, wherein the intermediate circuit voltage limiting circuit closes the circuit breaker when a voltage in the intermediate circuit exceeds a voltage threshold value.

The control circuit is for example a control device of the inverter and serves for the corresponding control of the high-side switching devices and the low-side switching devices for providing the A/C current or the three-phase current from the direct current of the intermediate circuit.

The intermediate circuit voltage limiting circuit on the other hand is provided for limiting the intermediate circuit voltage by means of the inverter. Preferably each of the switching inputs of the circuit breakers of all high-side switching devices or of all low-side switching devices is respectively connected on one side to the control circuit and on the other side to the intermediate circuit voltage limiting circuit. Each circuit breaker of the high-side switching devices or the low-side switching devices is thus assigned a respective such intermediate circuit voltage limiting circuit.

When the electric machine is operated as a generator and the inverter is correspondingly controlled, the inverter then serves for rectifying the A/C current or three-phase current generated by the electric machine. On the other hand, when the current generated by the electric machine is not required in the intermediate circuit, for example because an energy storage is decoupled from the intermediate circuit in particular due to a defect of the energy storage or because an onboard network of the motor vehicle connected to the intermediate circuit only requires a smaller amount of electrical current, the voltage may significantly increase in the intermediate circuit.

In order to prevent damage to the inverter and/or the onboard network or individual components thereof, the intermediate circuit voltage limiting circuit is provided. As soon as the intermediate circuit voltage limiting circuit determines that the intermediate circuit voltage present in the intermediate circuit exceeds the voltage value threshold it closes the circuit breaker assigned to it so that the circuit breaker becomes electrically conductive and correspondingly the power input is electrically connected with the power output. When the intermediate circuit voltage limiting circuit is assigned to the high-side switching device the first electrical pole can be directly connected with the second electrical pole when the intermediate circuit voltage limiting circuit is active and the circuit breaker of the low-side switching device is simultaneously closed so that the electrical energy present in the intermediate circuit is converted into heat by short circuiting the two poles.

Vice versa, of course the intermediate circuit voltage limiting circuit can be assigned to the low-side switching device. In this case the described process can be performed at simultaneously closed circuit breaker of the high-side switching device. Preferably it is therefore provided to continuously control the inverter for operating the electric machine, i.e., in particular to operate the electric machine as a motor or as an electric generator. Correspondingly at least those circuit breakers of the high-side switching device or the low-side switching device that are not assigned an intermediate circuit voltage limiting circuit are periodically closed and opened again. Therefore the electrical energy can be reduced via them at least periodically.

According to another advantageous feature of the invention, each circuit breaker can be assigned a separate intermediate circuit voltage limiting circuit. However, it can also be provided that the intermediate circuit voltage limiting circuit is assigned to multiple circuit breakers, in particular all circuit breakers of the high-side switching devices or the low-side switching devices. Preferably the intermediate circuit voltage limiting circuit is separate from the control circuit or the control device. In particular it is integrated in the high-side and the low-side switching devices.

According to another advantageous feature of the invention, the intermediate circuit voltage limiting circuit is assigned to the control circuit. When the control device determines that the intermediate circuit voltage exceeds the voltage threshold value it the control circuit can close the circuit breakers of the high-side switching device as well as the low-side switching device of at least one phase system, preferably of multiple phase systems or all phase systems and to correspondingly short circuit the first electrical pole with the second electrical pole. Correspondingly the inverter serves for efficiently reducing the over voltage present in the intermediate circuit via its phase systems.

According to another advantageous feature of the invention, the electric machine can be constructed as an asynchronous machine. While in synchronous machines, in particular permanently excited synchronous machines it can be provided that the electric machine is short circuited by means of the switching devices, which is also referred to as active short circuit, this is not permissible in the asynchronous machine. The reason for this is that the short-circuiting of the asynchronous machine results in a high short circuit current, which may destroy the inverter and/or the electric machine. This is prevented with the configuration of the inverter described above. In addition the inverter can have a so-called brake resistor in its intermediate circuit. Also via this brake resistor the first electrical pole can be short circuited with the second electrical pole in a targeted manner. However, for this purpose additional components are required, which is not the case to the same degree in the inverter according to the present description.

According to another advantageous feature of the invention, the intermediate circuit voltage limiting circuit has a Z-diode and a diode, wherein a cathode of the Z-diode is connected to the power input and an anode of the Z-diode is connected via the diode to the switching input of the respective circuit breaker. The Z-diode can also be referred to as a Zener diode. The Z-diode and the diode are connected in series with each other, and are connected on one side to the power input and on the other side to the switching input of the respective circuit breaker. More precisely the cathode of the Z-diode is connected to the power input while the anode is connected with the anode of the diode. The cathode of the diode on the other hand is connected to the switching input of the circuit breaker. In addition the control circuit can be connected to the switching input or the cathode of the diode.

The Z-diode and the diode together form a so-called "active clamping" circuit. The Z-diode has a defined Zener-voltage or a break-through voltage. When the intermediate circuit voltage reaches or exceeds this Zener-voltage the Z-diode is conductive. Correspondingly the switching input of the corresponding circuit breaker is impinged with a voltage or a current causing it to close.

According to another advantageous feature of the invention, the Zener voltage of the Z-diode corresponds to the voltage threshold value. It is particularly advantageous of course when the Z-diode prevents that the intermediate circuit voltage exceeds the voltages threshold value. For this reason the Z-diode is selected so that its Zener voltage is equal to the voltage threshold value. As an alternative the Zener voltage can also be slightly greater that the voltage threshold value, in particular at least 5%, at least 10%, at least 15% or at least 20% greater.

According to another advantageous feature of the invention, a capacitance is connected in parallel to the circuit breaker. The capacitance, i.e., for example a capacitor, is thus connected on one side to the power input and on the other side to the power output of the circuit breaker. The capacitance operates as a filter, in particular as a low pass filter. During normal operation of the inverter a short-term overvoltage, also referred to as commuting overvoltage, can occur via the circuit breaker. The commuting voltage however only occurs over a time period of at most 10 ns to at most 100 ns. In order to prevent that the intermediate circuit voltage limiting circuit already closes the circuit breaker as a result of this (permitted) overvoltage the capacitor for filtering the voltage generated over the circuit breaker is provided.

According to another advantageous feature of the invention, the circuit breaker can have a power transistor and a diode, which is connected in parallel with the power transistor. The circuit breaker insofar consists of multiple elements, i.e., the power transistor and the diode. The diode however does not correspond to the diode mentioned above which is a part of he intermediate circuit voltage limiting circuit. The diode is configured as a so-called freewheeling diode.

According to another advantageous feature of the invention, the intermediate circuit can have at least one intermediate circuit capacitor via which the electrical pole is connected with the second electrical pole. In particular the electrical connection between the electrical poles is accomplished permanently via the intermediate circuit capacitor. The intermediate circuit capacitor is for example connected in parallel with the phase systems with their high-side switching devices and low-side switching devices. The intermediate capacitor serves for voltage smoothing in the intermediate circuit. It can also be provided that multiple intermediate circuit capacitors are provided, which are connected in series with each other and are present between, and connected to, the first electrical pole and the second electrical pole. For example the first electrical pole is connected to the second intermediate circuit capacitor via a first intermediate capacitor, which on the other side is connected to the second electrical pole. The respective sides of the intermediate capacitors, which respectively face away from the poles can be connected to ground.

According to another advantageous feature of the invention, the intermediate circuit voltage limiting circuit closes the circuit breaker for a limited period of time when the voltage in the intermediate circuit exceeds the voltage threshold value. As a result of the closing of the circuit breaker or the simultaneous closing of the circuit breaker of the low-side switching device and the high-side switching device a high current flows over the circuit breakers, for example in the range of 1,000 A or 1,500 A. In order to avoid damage to the circuit breakers the two poles are only short-circuited via the circuit breaker over the defined period of time. This period of time is preferably selected so that also in the case of a high electrical current strength no damage to the circuit breaker can occur.

According to another advantageous feature of the invention, a closing time of the circuit breaker is monitored and/or limited by means of the control circuit. As mentioned above the control circuit and the intermediate circuit voltage limiting circuit are both connected to the circuit breaker. Correspondingly it can be provided that the control circuit senses whether the intermediate circuit voltage limiting circuit closes the circuit breaker. When this is determined for example a timer can be started.

When it is determined, for example with the timer, that the aforementioned defined time period since closure of the circuit breaker by the intermediate circuit voltage limiting circuit has passed it can be provided that the control circuit ends the closing or opens the circuit breaker again. This can for example be accomplished by connecting the switching input or the circuit breaker to ground, preferably via a sufficiently dimensioned resistance. Of course it can also be provided that the control circuit for limiting the closing time of the circuit breaker electrically interrupts an electrical connection between the intermediate circuit voltage limiting circuit and the circuit breaker or its switching input.

According to another aspect of the invention An electrical drive device for a motor vehicle, said electric drive device includes an electrical machine; and an inverter for controlling the electric machine, the inverter including multiple phase systems, each of the multiple phase systems including a high-side switching device and a low-side switching device, the high-side switching device being connected on one side to a first pole of an intermediate circuit and on another side to the low-side switching device, the low-side switching device being connected on one side to the high-side switching device and on the other side to a second pole of the intermediate circuit, the high-side switching device and the low-side switching device each having a circuit breaker which has a switching input, a power input and a power output, the power input and said power output being electrically connected with each other when the circuit breaker is closed and are electrically disconnected from each other when the circuit breaker is open, a control circuit, and an intermediate circuit voltage limiting circuit, said switching input of the circuit breaker of at least one of the high-side switching device and the low-side switching device being connected to the control circuit and to the intermediate circuit voltage limiting circuit, wherein the intermediate circuit voltage limiting circuit closes the circuit breaker when a voltage in the intermediate circuit exceeds a voltage threshold value.

According to another aspect of the invention a method for operating an inverter for an electric machine, includes, providing an inverter, wherein the inverter includes multiple phase systems, each of the multiple phase systems including a high-side switching device and a low-side switching device, the high-side switching device being connected on one side to a first pole of an intermediate circuit and on another side to the low-side switching device, the low-side switching device being connected on one side to the high-side switching device and on the other side to a second pole of the intermediate circuit, the high-side switching device and the low-side switching device each having a circuit breaker which has a switching input, a power input and a power output, the power input and said power output being electrically connected with each other when the circuit breaker is closed and are electrically disconnected from each other when the circuit breaker is open; a control circuit; and an intermediate circuit voltage limiting circuit, the switching input of the circuit breaker of at least one of the high-side switching device and the low-side switching device being connected to the control circuit and to the intermediate circuit voltage limiting circuit; and closing the circuit breaker with the intermediate circuit voltage limiting circuit when a voltage in the intermediate circuit exceeds a voltage threshold value.

BRIEF DESCRIPTION OF THE DRAWING

Other features and advantages of the present invention will be more readily apparent upon reading the following description of currently preferred exemplified embodiments of the invention with reference to the accompanying drawing, in which the sole FIGURE shows a schematic representation of a circuit arrangement, which includes an electric machine and an inverter for controlling the electric machine.

DETAILED DESCRIPTION OF PREFERRED EMBODIMENTS

Throughout all the Figures, same or corresponding elements may generally be indicated by same reference numerals. These depicted embodiments are to be understood as illustrative of the invention and not as limiting in any way. It should also be understood that the figures are not necessarily to scale and that the embodiments are sometimes illustrated by graphic symbols, phantom lines, diagrammatic representations and fragmentary views. In certain instances, details which are not necessary for an understanding of the present invention or which render other details difficult to perceive may have been omitted.

The FIGURE shows a schematic representation of the circuit arrangement 1. The circuit arrangement includes an electric machine 2 and an inverter 3, which serves for operating the electric machine 2. Via the inverter 3 the electric machine 2 is connected with an intermediate circuit 4 to which for example also a here not illustrated energy storage and/or an onboard network of the motor vehicle are connected. In the intermediate circuit 4 at least one intermediate circuit capacitor 5 (here: between two circuit capacitors 5) can be provided. The intermediate circuit 4 can form at least a part of the inverter 3. The intermediate circuit 4 has a first electrical pole 6 and a second electrical pole 7. The two poles 6 and 7 have different electrical potentials. For example the first pole 6 is configured as a plus pole and the second pole 7 as a minus pole.

The intermediate circuit 4 is operated with DIC current, which is for example withdrawn from the energy storage. The electric machine 2 on the other hand is an NC current machine or a three-phase machine. Correspondingly the electric machine has phase connections 8, 9 and 10. The electric machine is for example constructed as an asynchronous machine. The inverter 3 serves for converting the DIC current of the intermediate circuit 4 into an A/C current or a three-phase current and to provide the electric current to the electric machine 2 via the phase connections 8, 9 and 10. Vice versa of course with the aid of the inverter 3 also an A/C current or three phase current, which is generated during operation of the electric machine as generator, can be converted into a DIC current and supplied to the intermediate circuit 4.

The inverter 3 has multiple phase systems, in the here shown exemplary embodiment three phase systems 11, 12 and 13. The phase system 11 has a high-side switching device 14 with a circuit breaker 15 and a low-side switching device 16 with a circuit breaker 17. The phase system 12 has a high-side switching device 18 with a circuit breaker 19 and a low-side switching device 20 with a circuit breaker 21. The phase system 13 has a high-side switching device 22 with a circuit breaker 23 and a low-side switching device 24 with a circuit breaker 25. Each circuit breaker 15, 17, 19, 21 23 and 25 consists of a power transistor 26 and a diode 27, which is preferably constructed as a freewheeling diode. Each of the circuit breakers 15, 17, 19, 21, 23 and 25 additionally has a switching input 28, a power input 29 and a power output 30.

Each of the switching inputs 28 is electrically connected with a control circuit 31. By means of the control circuit 31 the circuit breakers 17, 19, 21 23 and 25 or the corresponding power transistors 26 are controlled either to convert the direct current of the intermediate circuit 4 into alternating current or vice versa to convert the alternating current or the three-phase current of the electric machine 2 into direct current for the intermediate circuit.

In addition a respective intermediate circuit voltage limitation circuit 32 is assigned to the circuit breakers 15, 17, 19, 21 23 and 25 of the high-side switching devices 14, 16 and 18. The intermediate circuit voltage limitation circuit has a Z-diode 33 and a diode 34 which are connected with each other in series. In particular one cathode of the Z-diode 33 is connected with the respective power input 29 of the corresponding circuit breaker 15, 17 or 19, while an anode of the Z-diode 33 is connected with the corresponding switching input 28 via the diode 34. Further a capacitance 35 is connected in parallel to each of the circuit breakers 15, 17 and 19. The capacitance functions as a filter, in particular a low pass filter.

Beside the here shown elements of the switching circuit 1 the switching circuit has multiple not further indicated inductivities. These can but do not have to be present. In the here shown case they only serve for illustrating parasitic inductivities. As an alternative to the here shown representation the intermediate circuit voltage limiting circuits 32 may be assigned to the low-side switching devices 16, 20 and 24 instead of the high-side switching devices 18, 20 and 22.

The intermediate circuit voltage limitation circuit 32 serves for limiting an intermediate circuit voltage present in the intermediate circuit 4. This voltage can for example increase strongly when the electric machine 2 is operated as a generator and no sufficiently dimensioned electrical user for example in the form of an onboard network of the motor vehicle and/or the energy storage is available in the intermediate circuit 4. Nevertheless also in this case operation of the inverter 3 is first continued normally, i.e., with the aid of the control circuit 31 the phase systems 11, 12 and 13 are controlled for converting or rectifying. In addition a Zener voltage of the Z-diodes 33 is selected to be equal to a voltage threshold value for the intermediate voltage.

When the intermediate circuit voltage exceeds this voltage threshold value the Z-diodes 33 become conductive when simultaneously the low-side switching device 16, 20 or 24 of the corresponding phase system 11, 12 or 13 are conductive or the corresponding circuit breaker 17, 21 or 25 is closed. When the Z-diode 33 is conductive the switching input 28 of the corresponding circuit breaker 15, 19 or 23 is impinged with a voltage or a current so that it closes.

Correspondingly in this case a short circuit of the poles 6 and 7 of the intermediate circuit 4 is established via the corresponding phase system 11, 12 or 13 so that the over voltage present in the intermediate circuit 4 is reduced via the phase system 11, 12 or 13. Because the overvoltage is reduced very fast and the previously conductive Z-diode blocks again after the intermediate circuit voltage has fallen below the voltage threshold value again, no damage to the inverter can occur.

What is claimed as new and desired to be protected by Letters Patent is set forth in the appended claims and includes equivalents of the elements recited therein:

What is claimed is:

1. An inverter for an electric machine, said inverter, comprising:
   multiple phase systems, each of said multiple phase systems comprising a high-side switching device and a low-side switching device, said high-side switching device being connected on one side to a first pole of an intermediate circuit and on another side to the low-side switching device, said low-side switching device being connected on one side to the high-side switching device and on the other side to a second pole of the intermediate circuit, said high-side switching device and said low-side switching device each having a circuit breaker which has a switching input, a power input and a power output, said power input and said power output being electrically connected with each other when the circuit breaker is closed and are electrically disconnected from each other when the circuit breaker is open;
   a control circuit; and
   an intermediate circuit voltage limiting circuit, said switching input of the circuit breaker of at least one of the high-side switching device and the low-side switching device being connected to the control circuit and to the intermediate circuit voltage limiting circuit, said intermediate circuit voltage limiting circuit closing the circuit breaker when an input voltage in the intermediate circuit exceeds a voltage threshold value,
   wherein the intermediate circuit voltage limiting circuit comprises a Z-diode and a diode, wherein a cathode of the Z-diode is connected to the power input and an anode of the Z-diode is connected to the switching input of the respective circuit breaker via the diode, and wherein a Zener voltage of the Z-diode corresponds to a voltage exceeding the voltage threshold value by at least 5% and up to 20%.

2. The inverter of claim 1, further comprising a capacitance connected in parallel to the circuit breaker.

3. The inverter of claim 1, wherein the circuit breaker has a power transistor and a diode connected in parallel to the power transistor.

4. The inverter of claim 1, wherein the intermediate circuit has at least one intermediate circuit capacitor via which the first electrical pole is connected with the second electrical pole.

5. The inverter of claim 1, wherein said intermediate circuit voltage limiting circuit closes the circuit breaker for a limited period of time when the input voltage in the intermediate circuit exceeds the voltage threshold value.

6. The inverter of claim 1, wherein the control circuit is adapted to at least one of monitoring a closing time of the circuit breaker and limiting the closing time of the circuit breaker.

7. An electric drive device for a motor vehicle, said electric drive device comprising:
an electrical machine; and
an inverter for controlling the electric machine, said inverter comprising multiple phase systems, each of said multiple phase systems comprising a high-side switching device and a low-side switching device, said high-side switching device being connected on one side to a first pole of an intermediate circuit and on another side to the low-side switching device, said low-side switching device being connected on one side to the high-side switching device and on the other side to a second pole of the intermediate circuit, said high-side switching device and said low-side switching device each having a circuit breaker which has a switching input, a power input and a power output, said power input and said power output being electrically connected with each other when the circuit breaker is closed and are electrically disconnected from each other when the circuit breaker is open,
a control circuit, and
an intermediate circuit voltage limiting circuit, said switching input of the circuit breaker of at least one of the high-side switching device and the low-side switching device being connected to the control circuit and to the intermediate circuit voltage limiting circuit, said intermediate circuit voltage limiting circuit closing the circuit breaker when an input voltage in the intermediate circuit exceeds a voltage threshold value, wherein the intermediate circuit voltage limiting circuit comprises a Z-diode and a diode, wherein a cathode of the Z-diode is connected to the power input and an anode of the Z-diode is connected to the switching input of the respective circuit breaker via the diode, and wherein a Zener voltage of the Z-diode corresponds to a voltage exceeding the voltage threshold value by at least 5% and up to 20%.

8. A method for operating an inverter for an electric machine, comprising:
providing an inverter, said inverter, comprising:
multiple phase systems, each of said multiple phase systems comprising a high-side switching device and a low-side switching device, said high-side switching device being connected on one side to a first pole of an intermediate circuit and on another side to the low-side switching device, said low-side switching device being connected on one side to the high-side switching device and on the other side to a second pole of the intermediate circuit, said high-side switching device and said low-side switching device each having a circuit breaker which has a switching input, a power input and a power output, said power input and said power output being electrically connected with each other when the circuit breaker is closed and are electrically disconnected from each other when the circuit breaker is open;
a control circuit; and
an intermediate circuit voltage limiting circuit, said switching input of the circuit breaker of at least one of the high-side switching device and the low-side switching device being connected to the control circuit and to the intermediate circuit voltage limiting circuit; and
closing the circuit breaker with the intermediate circuit voltage limiting circuit when an input voltage in the intermediate circuit exceeds a voltage threshold value,
wherein the intermediate circuit voltage limiting circuit comprises a Z-diode and a diode, wherein a cathode of the Z-diode is connected to the power input and an anode of the Z-diode is connected to the switching input of the respective circuit breaker via the diode, and
wherein a Zener voltage of the Z-diode corresponds to a voltage exceeding the voltage threshold value by at least 5% and up to 20%.

* * * * *